(12) United States Patent
Djigo et al.

(10) Patent No.: US 11,418,019 B2
(45) Date of Patent: Aug. 16, 2022

(54) METHOD AND DEVICE FOR DETECTING AN ELECTRIC ARC IN AN ELECTRICAL SYSTEM

(71) Applicants: Commissariat à l'Energie Atomique et aux Energies Alternatives, Paris (FR); UNIVERSITE GRENOBLE ALPES, Saint Martin d'Heres (FR); INSTITUT POLYTECHNIQUE DE GRENOBLE, Grenoble (FR); CENTRE NATIONAL DE LA RECHERCHE SCIENTIFIQUE, Paris (FR)

(72) Inventors: Ibrahima Djigo, Grenoble (FR); Vincent Heiries, Grenoble (FR); Olivier Michel, Grenoble (FR)

(73) Assignees: Commissariat À L'energie Atomique Et Aux Energies Alternatives, Paris (FR); Universite Grenoble Alpes, Saint Martin D'Heres (FR); Institut Polytechnique De Grenoble, Grenoble (FR); Centre National De La Recherche Scientifique, Paris (FR)

( * ) Notice: Subject to any disclaimer, the term of this patent is extended or adjusted under 35 U.S.C. 154(b) by 490 days.

(21) Appl. No.: 16/671,457

(22) Filed: Nov. 1, 2019

(65) Prior Publication Data
US 2020/0144806 A1    May 7, 2020

(30) Foreign Application Priority Data
Nov. 2, 2018 (FR) .................................... 1871353

(51) Int. Cl.
*H02H 1/00* (2006.01)
*G06K 9/62* (2022.01)
*G01R 31/12* (2020.01)

(52) U.S. Cl.
CPC ....... *H02H 1/0023* (2013.01); *G01R 31/1209* (2013.01); *G06K 9/6255* (2013.01); *G06K 9/6262* (2013.01); *H02H 1/0015* (2013.01)

(58) Field of Classification Search
CPC .. H02H 1/0023; H02H 1/0015; H02H 1/0092; G06K 9/6255; G06K 9/6262; G01R 31/1209

(Continued)

(56) References Cited

U.S. PATENT DOCUMENTS 9,837,810 B2 *  12/2017  Tatry ..................... B64D 45/00
2018/0204132 A1 *  7/2018  Liang ..................... G06T 7/0004

FOREIGN PATENT DOCUMENTS

EP    3018781 A1    5/2016

OTHER PUBLICATIONS

Pati, Y.C. et al., "Orthogonal matching pursuit: Recursive function approximation with applications to wavelet decomposition", Proceedings of 27th Asilomar Conference on Signals, Systems and Computers, 1993, pp. 40-44, DOI: 10.1109/ACSSC.1993.342465.

(Continued)

*Primary Examiner* — Kevin J Comber
(74) *Attorney, Agent, or Firm* — Moreno IP Law LLC

(57) ABSTRACT

The present disclosure relates to a method for detecting an electric arc in an electrical system (100), comprising the following steps: a) acquiring a signal (104) coming from at least one sensor (102) detecting acoustic waves in the system (100); b) calculating, using an electronic processing device (106), a first value representative of the error between the signal and a first projection of the signal in a first representation space defined by a first dictionary matrix; b) calculating, using the electronic processing device (106), a second value representative of the error between the signal and a second projection of the signal in a second represen- (Continued)

tation space defined by a second dictionary matrix; and d) determining, from the first and second values, whether an electric arc has been produced in the system.

8 Claims, 2 Drawing Sheets

(58) Field of Classification Search
USPC .......................................................... 700/293
See application file for complete search history.

(56) References Cited

OTHER PUBLICATIONS

Preliminary Search Report for French Application No. 1871353 dated Jul. 19, 2019, 4 pages.

Q Xie, et al., "Application of Signal Sparse Decomposition in the Detection of Partial Discharge by Ultrasonic Array Method," IEEE Transactions on Dielectrics and Electrical Insulation, vol. 22, No. 4, Aug. 2015, pp. 2031-2040.

F. Thome de A. Silva, et al., "A systematic method to compose over complete dictionaries for the processing of partial discharge signals," 2nd International Symposium on Instrumentation Systems, Circuits and Transducers, Aug. 28, 2017, 6 pages.

F. Thome de A. Silva, et al., "Partial Discharge signal processing using overcomplete dictionaries and sparse representations," 2017 Electrical Insulation Conference, Jun. 2017, pp. 388-391.

M. Aharon, et al., "K-SVD: An Algorithm for Designing Overcomplete Dictionaries for Sparse Representation," IEEE Trans. Signal Processing, vol. 54, No. 11, Nov. 2006, pp. 4311-4322.

X. Jiang, et al., "A Fast Algorithm for Sparse Channel Estimation via Orthogonal Matching Pursuit," IEEE 73rd Vehicular Technology Conference, May 15, 2011, 5 pages.

T. Schnier, et al., "SparkDict: A Fast Dictionary Learning Algorithm," 25th European Signal Processing Conference, Aug. 28, 2017, pp. 1564-1568.

* cited by examiner

METHOD AND DEVICE FOR DETECTING AN ELECTRIC ARC IN AN ELECTRICAL SYSTEM

FIELD

The present disclosure relates to a method and a device for detecting the formation of an electric arc in an electrical system from its acoustic signature.

BACKGROUND

In many electrical systems, in particular high-voltage systems such as electrical cabinets, transformers, electric batteries, electrical distribution grids, etc., electric arcs can form, for example following an overvoltage or a failure such as the breaking of a cable or the wear of insulation. If it is maintained, an electric arc can cause serious damage and in particular cause a fire to break out. Electric arcs are particularly dangerous in DC electrical systems, inasmuch as one cannot count on a "natural" reset of the supply voltage to cause the extinction of the arc. Early detection of electric arc formation is a major issue for the safety of many electrical systems.

Various solutions have been proposed to detect the formation of an electric arc in an electrical system. Detection methods have in particular been proposed based on current and voltage measurements in the system, as well as detection methods based on optical signal measurements, detection methods based on electromagnetic signal measurements, and detection methods based on acoustic signal measurements.

Here, detection methods are more particularly considered based on acoustic signal measurements.

SUMMARY

Thus, one embodiment provides a method for detecting an electric arc in an electrical system, comprising the following steps:
a) acquiring a signal coming from at least one sensor detecting acoustic waves in the system;
b) calculating, using an electronic processing device, a first value representative of the error between the signal and a first projection of the signal in a first representation space defined by a first dictionary matrix;
c) calculating, using the electronic processing device, a second value representative of the error between the signal and a second projection of the signal in a second representation space defined by a second dictionary matrix; and
d) determining, from the first and second values, whether an electric arc has been produced in the system.

According to one embodiment, in step d), the processing device determines whether or not the ratio of the second value to the first value is above a predetermined threshold, and deduces therefrom whether or not an electric arc has been produced in the system.

According to one embodiment, the threshold is calculated as a function of specified values of the probability of a false alarm and of the probability of non-detection.

According to one embodiment, the threshold is equal to 1.

According to one embodiment, in step b), the first value is determined by an adaptive pursuit iterative algorithm comprising the following successive steps:
e1) defining a residue vector ERR0 and assigning to it the value of the signal;
e2) searching in the first dictionary matrix for the column vector D0<j> that is most correlated with the residue vector ERR0;
e3) subtracting, from the residue vector ERR0, the contribution to the residue vector ERR0 of the column vector D0<j> determined in the preceding step;
e4) repeating the steps e2) and e3) a predetermined number T0 of times; and
e5) assigning to the first value a value representative of the norm of the residue vector ERR0.

According to one embodiment, in step c), the second value is determined by an adaptive pursuit iterative algorithm comprising the following successive steps:
e1') defining a residue vector ERR1 and assigning to it the value of the signal;
e2') searching in the second dictionary matrix for the column vector D1<j> that is most correlated with the residue vector ERR1;
e3') subtracting, from the residue vector ERR1, the contribution to the residue vector ERR1 of the column vector D1<j> determined in the preceding step;
e4') repeating the steps e2') and e3') a predetermined number T1 of times; and
e5') assigning to the second value a value representative of the norm of the residue vector ERR1.

According to one embodiment, the first and second dictionary matrices are chosen such that:
the first value is greater than the second value when the signal is a characteristic signal of an arc; and
the first value is lower than the second value when the signal is a characteristic signal of a shock arc.

According to one embodiment, the first and second dictionary matrices are determined by learning from a first set of characteristic acoustic signals of shocks in the electrical system and a second set of characteristic acoustic signals of electric arcs in the electrical system.

According to one embodiment, the method further comprises a step of securing the electrical system when it is determined in step d) that an electric arc has occurred in the electrical system.

According to one embodiment, the securing step comprises triggering an alarm.

According to one embodiment, the securing step comprises interrupting an electrical supply current of the electrical system.

Another embodiment provides a device for detecting an electric arc in the electrical system, comprising a sensor detecting acoustic waves in the system, and an electronic processing device configured to implement a method as defined herein above.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the electrical systems in which one seeks to detect electric arcs have not been described in detail, the described detection solutions being compatible with all electrical systems in which electric arcs can occur.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%, and still more preferably within 1%.

Figure 1:
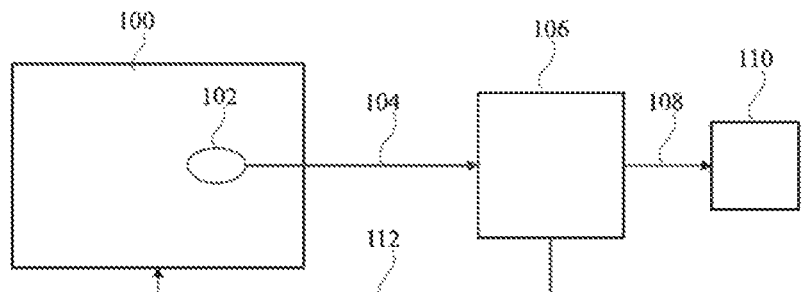
FIG. 1 illustrates an electrical system provided with a device for detecting an electric arc according to one example of an embodiment.

FIG. 1 shows an electrical system 100 to be monitored, for example an electrical cabinet, an electrical distribution grid in an airplane, an electric battery, or any other electrical system in which one wishes to be able to detect any appearance of an electric arc.

The electrical system 100 is equipped with a device for detecting an electric arc including an acoustic sensor 102, for example an ultrasound sensor, configured to detect acoustic waves in the electrical system 100. The formation of an electric arc is in fact accompanied by the emission of characteristic acoustic waves whose detection can make it possible to identify the presence of the arc. The sensor 102 can be arranged on a wall of a housing of the electrical system 100, or in physical contact with an electrical conductor that one especially wishes to monitor in the system 100. Although a single sensor 102 is illustrated in FIG. 1, in embodiment variants, several sensors 102 can be provided to monitor different parts of the system 100.

The sensor 102 supplies an output signal 104 to an electronic processing device 106 of the device for detecting an electric arc. As an example, the output signal 104 of the sensor 102 is a digital signal, and the processing device 106 is a digital processing circuit for example comprising a microprocessor. The output signal 104 is a signal in the temporal domain, representing the evolution as a function of time of the amplitude of the acoustic waves captured by the sensor 102. The processing device 106 is configured to analyze the signal supplied by the sensor 102 in order to detect any presence of an electric arc in the system 100.

The acoustic signal 104 is for example generated by a single acoustic sensor.

The processing device 106 for example supplies an output signal 108 to an output module 110 of the device for detecting an electric arc, which can be an alarm, a display, or any other interface element making it possible to inform a user of the presence of an arc in the system 100.

The processing device 106 can supply, in addition to or in place of the output signal 108, an output signal 112 returned toward the system 100, which can for example control the securing of the system 100 when an electric arc is detected, for example by interrupting the supply current in all or part of the system 100. As an example, in the case where the sensor 102 is arranged in contact with an electric conductor of the system 100, the electric current circulating in this conductor can be interrupted when an arc is detected.

Figure 2:
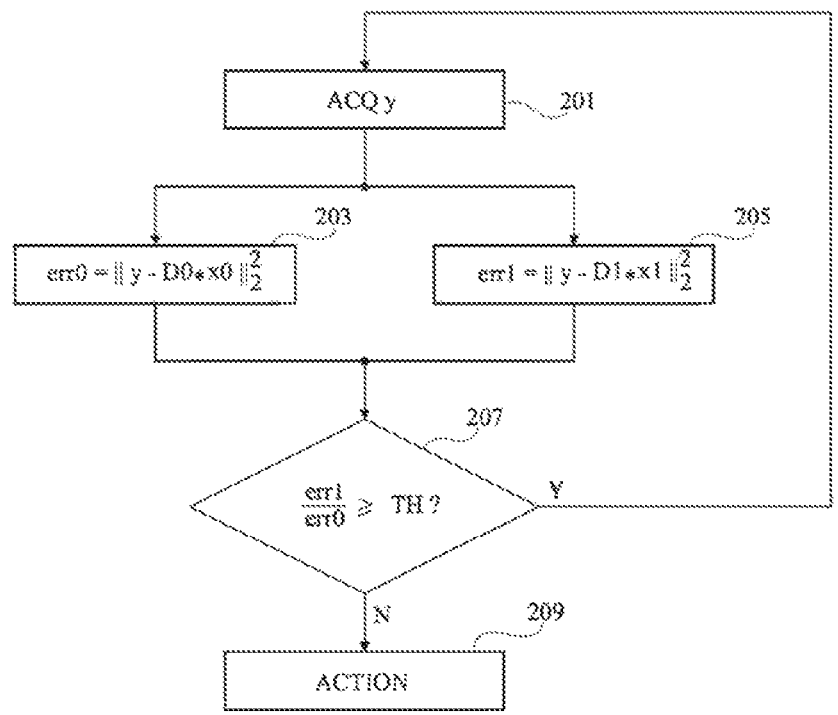
FIG. 2 illustrates a flowchart illustrating steps of a method for detecting an electric arc according to one example of an embodiment.

FIG. 2 illustrates a flowchart illustrating steps of a method for detecting an electric arc according to one embodiment. This method can be implemented by the processing device 106 of the electric arc detection device of FIG. 1 in order to conduct continuous monitoring of the system 100 and to detect the formation of an electric arc as quickly as possible.

The method of FIG. 2 comprises a step 201 for acquiring a signal y corresponding to a sequence of n consecutive samples y[i] of the output signal 104 from the sensor 102, where n is an integer greater than or equal to 2, and i is an integer from 1 to n. As an example, the number of samples n of the signal y is between 1000 and 10,000, for example in the order of 6000. The acquisition frequency of the samples is for example between 200 kHz and 10 MHz, for example in the order of 1 MHz (or an acquisition duration of about 6 ms for a signal y of about 6000 samples).

The method further comprises, after the step 201:

a step 203 for determining, using the processing device 106, a projection x0 of the signal y in a representation space defined by a dictionary matrix D0, and of a residue value err0 representative of the error between the signal y and the projection x0; and a step 205 for determining, using the processing device 106, a projection x1 of the signal y in a representation space defined by a dictionary matrix D1, and of a residue value err1 representative of the error between the signal y and the projection x1.

The matrix D1 is chosen such that the projection error err1 of the signal y on the matrix D1 is relatively weak when the signal y is a characteristic acoustic signal of an electric arc, and relatively strong when the signal y is a characteristic acoustic signal of any other phenomenon capable of occurring during the normal operation of the electrical system being monitored and generating acoustic waves in the system. Subsequently, for simplification, "shock" will refer to any phenomenon other than an electric arc that may occur during the normal operation of the system and generating acoustic waves able to be measured by the sensor 102.

The matrix D0 is in turn chosen such that the projection error err0 of the signal y on the matrix D0 is relatively weak when the signal y is a characteristic acoustic signal of a shock, and relatively strong when the signal y is a characteristic acoustic signal of an electric arc.

In other words, the matrices D1 and D0 are determined, during the learning phase (as will be described in more detail hereinafter), such that the matrix D1 is more characteristic of electric arcs than of shocks, and such that the matrix D0 is more characteristic of shocks than of electric arcs.

The matrices D0 and D1 are matrices of n rows by K0 and K1 columns, respectively, with K0 and K1 being integers greater than or equal to 2, and preferably, strictly less than n. Thus, the projections x0 and x1 of an acoustic signal y with size n on the matrices D0 and D1 are respectively a vector with size K0 and a vector with size K1.

As an example, the projection error values err0 and err2 are defined as follows:

$$err0 = \|y - D0*x0\|_2^2$$

$$err1 = \|y - D1*x1\|_2^2$$

During steps 203 and 205, the projections x0 and x1 can be determined using any known method for determining a projection of a signal y on a dictionary matrix. Preferably, a matching pursuit algorithm, for example an orthogonal matching pursuit algorithm, is used to determine the projection x0 and the projection error err0 on the one hand, and the projection x1 and the projection error err1 on the other hand. Such algorithms are for example described in the article titled "Adaptive time-frequency decompositions with matching pursuits" by G. Davis et al. (1994, Optical Engineering. 33: 2183), and in the article titled "Orthogonal Matching Pursuit: recursive function approximation with application to wavelet Decomposition" by Y. Pati et al. (1993, Asilomar Conf. on Signals, Systems and Comput.), the contents of these articles being incorporated herein by reference.

As an example, the projection error err0 of the signal y on the matrix D0 is determined by an adaptive pursuit iterative algorithm comprising the following successive steps:

e1) defining a residue vector ERR0 with size n and assigning to it the value y (ERR0=y);

e2) searching in the dictionary matrix D0 for the column vector with size n D0<j> most correlated to the residue vector ERR0, that is to say, that whose scalar product with the residue vector ERR0 is the largest in terms of absolute value (with j being an integer comprised in the range from 1 to K0); and e3) subtracting, from the residue vector ERR0, the contribution to the residue vector ERR0 of the column vector D0<j> determined in the preceding step, and reassigning, to the residue vector ERR0, the result of the subtraction (ERR0=ERR0−<ERR0; D0<j>> *D0<j>, where <ERR0; D0<j>> designates the scalar product of the vectors ERR0 and D0<j>).

Steps e2 and e3 are repeated T0 times, where T0 is a predetermined integer greater than or equal to 2.

At the end of the T0 iterations, the projection error err0 of the signal y on the matrix D0 can be defined as follows:

$$err0 = \|ERR0\|_2^2$$

Similarly, the projection error err1 of the signal y on the matrix D1 can be determined by an adaptive pursuit iterative algorithm comprising the following successive steps:

e1') defining a residue vector ERR1 with size n and assigning to it the value y (ERR1=y);

e2') searching in the dictionary matrix D1 for the column vector with size n D1<j'> most correlated to the residue vector ERR1, that is to say, that whose scalar product with the residue vector ERR1 is the largest in terms of absolute value (with j' being an integer comprised in the range from 1 to K1); and e3') subtracting, from the residue vector ERR1, the contribution to the residue vector ERR1 of the column vector D1<j'> determined in the preceding step, and reassigning, to the residue vector ERR1, the result of the subtraction (ERR1=ERR1−<ERR1; D1<j'>> *D1<j'>, where <ERR1; D1<j'>> designates the scalar product of the vectors ERR1 and D1<j'>).

Steps e2' and e3' are repeated T1 times, where T1 is a predetermined integer greater than or equal to 2.

At the end of the T1 iterations, the projection error err1 of the signal y on the matrix D1 can be defined as follows:

$$err1 = \|ERR1\|_2^2$$

The values T0 and T1 can be determined during a configuration phase of the processing algorithm, for example jointly with the matrices D0 and D1, so as to:

minimize the projection error err0 of the shock-type signals y on the matrix D0 and maximize the projection error err0 of the arc-type signals y on the matrix D0; and minimize the projection error err1 of the shock-type signals y on the matrix D1 and maximize the projection error err1 of the arc-type signals y on the matrix D1.

Steps 203 and 205 can be implemented in parallel or sequentially.

The method of FIG. 2 further comprises, after steps 203 and 205, a step 207 for detecting the presence or absence of an electric arc by comparing the projection error values err0 and err1 determined in steps 203 and 205.

More particularly, in this example, the processing device 106 compares the ratio err1/err0 to a predetermined threshold TH.

If the ratio err1/err0 is greater than or equal to the threshold TH (Y), the processing device 106 deduces therefrom that the acoustic input signal y is not the signature of an electric arc. The method then resumes from step 201, with the acquisition of a new acoustic input signal y.

If, conversely, the ratio err1/err0 is less than the threshold TH (N), the processing device 106 deduces therefrom that the acoustic input signal y is characteristic an electric arc. A step 209 for protecting the electrical system 100 is then implemented by the processing device 106, for example consisting of triggering an alarm and/or interrupting an electric supply current of the electrical system 100.

The threshold TH is for example equal to 1. In this case, the test conducted in step 207 consists of determining whether the projection error of the signal y on the dictionary of the arcs D1 is:

greater than or equal to the projection error of the signal y on the dictionary of the shocks D0, in which case the processing device 106 deduces therefrom that the acoustic input signal y is not the signature of an electric arc; or less than the projection error of the signal y on the dictionary of the shocks D0, in which case the processing device 106 deduces therefrom that the acoustic input signal y is the signature of an electric arc.

As a variant, the threshold TH can be different from 1, depending on the detection performances that one is seeking to obtain. More generally, the threshold TH can be set as a function of thresholds targeted in terms of probability of false detection or false alarm (Pfa) or probability of non-detection (Pnd).

The dictionary matrices D0 or D1 as well as the values T0 and T1 can be determined by learning during an initial configuration phase of the detection algorithm, for example from acoustic arc and shock signals actually measured in the electrical system during a characterization phase of the system, [or] from a database of acoustic arc and shock signals measured in other electrical systems.

As an example, two subsets of acoustic signals are considered denoted Y0 and Y1. The set Y0, called shock matrix, is made up of a set of column vectors with size n corresponding to acoustic signals actually measured that are characteristic of shocks in an electrical system. The set Y1, called arc matrix, is made up of a set of column vectors with sizes n corresponding to acoustic signals actually measured that are characteristic of electric arcs in an electrical system.

As an example, the dictionary matrix D0 and the dictionary matrix D1 are determined from the shock matrix Y0 and the arc matrix Y1 by a principal component analysis method. By construction, all of the column vectors of each dictionary matrix are then orthogonal two by two.

As a variant, the dictionary matrix D0 and the dictionary matrix D1 are determined respectively from the shock matrix Y0 and the arc matrix Y1 by a decomposition matrix on a non-orthogonal dictionary, by a K-SVD type method, for example as described in the article titled "K-Svd: An algorithm for designing overcomplete dictionaries for sparse representation" by M. Aharon et al. (IEEE Transactions on signal processing, 54(11):4311-4322, 2006), the contents of which is hereby incorporated by reference.

One advantage of the K-SVD method relative to the principal component analysis method is that it makes it possible to relax the orthogonality constraint and thus to obtain dictionaries that are better suited to the representation of the acoustic arc and shock signals, and therefore to minimize the error committed by approximating the acoustic signal and by projecting it on the dictionary D0 or D1.

Preferably, the dictionary matrix D0 and the dictionary matrix D1 are determined from the shock matrix Y0 and the arc matrix Y1 by a decomposition matrix on a non-orthogonal dictionary, by imposing a low coherence constraint between the dictionaries D0 and D1, by a DLSI type method, for example as described in the article titled "Classification and clustering via dictionary learning with structured incoherence and shared features" by I. Ramirez et al. (In Computer Vision and Pattern Recognition, CVPR, 2010 IEEE Conference on, pages 3501-3508), the contents of which is hereby incorporated by reference.

Indeed, one limitation of the K-SVD method mentioned above is that the dictionary matrices D0 and D1 are calculated separately for each signal class. There is therefore a risk of obtaining a relatively strong coherence between the vectors of the two dictionaries (that is to say, an acoustic signal can be as strongly correlated with the matrix D0 as with the matrix D1). In this case, the representation of an acoustic arc or shock signal y could be as good on the shock dictionary D0 as on the arc signal D1, preventing a good discrimination of the arcs relative to the shocks (even if the signal is well represented on each of the dictionaries). The DLSI method introduces a parameter making it possible to inspect the coherence between the dictionaries and to force a relatively low coherence between the two dictionaries. In other words, the DLSI method makes it possible to determine two dictionaries that are sufficiently decorrelated relative to one another, while making sure to keep a good representation capacity of the acoustic signals. Indeed, in practice it is as important to be able to represent the signals well on the dictionaries as to obtain a good discrimination between the arcs and the shocks. The DLSI method makes it possible to obtain a good compromise between these two objectives.

The DLSI method for example consists of solving the following minimization problem:

$$\underset{\{Dr, xr\}, r=0,1}{\operatorname{argmin}} \sum_{r=0}^{1} \|Yr - Dr * xr\|_F^2 + P * \|D0^T * D1\|_F^2$$

where the term:

$$\|D0^T * D1\|_F$$

designates the normalized value according to the Frobenius norm of the matricial product of the transform of D0 by D1, and where P is a weight coefficient making it possible to inspect the coherence between the matrices D0 and D1. In other words, the DLSI method leads to jointly minimizing the representation error of the signals of the shock matrix Y0 on the dictionary D0, the representation error of the signals of the arc matrix Y1 on the dictionary D1, and the correlation between the dictionaries D0 and D1. The higher the coefficient P is chosen to be, the less coherent the dictionary matrices D0 and D1 will be, potentially at the expense of a reduced representation capacity of the signals.

It will be noted that as a variant, rather than performing learning of the dictionary matrices D0 and D1 on solid signals (that is to say, with size n), it will be possible to perform the learning from smaller signals, obtained by combining components of the solid signals (that is to say, the column vectors of the matrices Y0 and Y1), weighted by random or pseudorandom coefficients, as for example described in the article titled "Compressive k-svd" by Farhad Pourkamali Anaraki et al. (Acoustics, Speech and Signal Processing, ICASSP, 2013 IEEE, pages 5469-5473), the contents of which is hereby incorporated by reference.

In this case, the detection strictly speaking will be able to be done from smaller acoustic input signals y, also obtained by combining components of the solid signal, weighted by random or pseudo-random coefficients. This advantageously makes it possible to reduce the quantity of data to be sent to the processing device 106 and/or to be processed by the processing device 106 during the detection phase strictly speaking.

Figure 3:
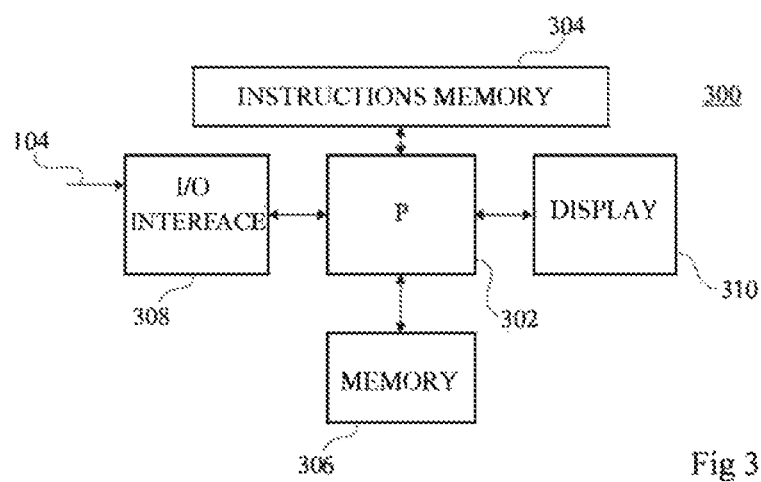
FIG. 3 illustrates a device configured to carry out a method for detecting an electric arc according to one example of an embodiment.

FIG. 3 illustrates an exemplary embodiment of the processing device 106 of FIG. 1. The device 106 may comprise one or several processors 302 (P) receiving instructions stored in an instruction memory 304. The processing device 300 may further include a memory 306 configured to store the different properties calculated during the implementation of the electric arc detection method, for example the projection errors err0 and err1 of the input signal y on the dictionary matrices D0 and D1. The memory 306 can further store the signal variable over time 104 coming from the sensor 102, which is for example received by the processor 302 by means of an input/out interface 308. Furthermore, the memory 306 can store the coefficients of the dictionary matrices D0 and D1 used by the detection method. The input/output interface 308 can further supply the output signal 112 of the device 106 configured to control the operation of the electrical system 100 in the case where an electric arc is detected. The processing device 300 for example also comprises a display 310, which for example supplies a user interface and means for alerting a user if an electric arc is detected.

Various embodiments and variants have been described. Those skilled in the art will understand that certain features of these embodiments can be combined and other variants will readily occur to those skilled in the art. In particular, the described embodiments are not limited to the exemplary methods for learning dictionary matrices D0 and D1 described hereinabove. Furthermore, the described embodiments are not limited to the example described above of methods for projecting and calculating the projection error of the acoustic input signal y on the dictionary matrices D0 and D1. Furthermore, the described embodiments are not limited to the examples of numerical values mentioned in the present disclosure.

What is claimed is:

1. A method for detecting an electric arc in an electrical system, comprising the following steps:
   a) acquiring a first signal coming from at least one sensor detecting acoustic waves in the system;
   b) calculating, using an electronic processing device, a first value representative of the error between the first signal and a first projection of the first signal in a first representation space defined by a first dictionary matrix;
   c) calculating, using the electronic processing device, a second value representative of the error between the first signal and a second projection of the first signal in a second representation space defined by a second dictionary matrix; and
   d) comparing the first and second values using the electronic processing device and deducing whether an electric arc has been produced in the system,
   wherein the first and second dictionary matrices are determined, during a prior characterization phase, by learning from a first set of characteristic acoustic signals of shocks in the electrical system and a second set of characteristic acoustic signals of electric arcs in the electrical system, in order to:
   minimize a projection error of the shock signals on the first matrix and maximize a projection error of the arc signals on the first matrix;
   minimize a projection error of the arc signals on the second matrix and maximize a projection error of the shock signals on the second matrix, and
   wherein, in step d), the processing device determines whether or not the ratio of the second value to the first value is above a predetermined threshold, and deduces therefrom whether or not an electric arc has been produced in the system.

2. The method according to claim 1, wherein the threshold is equal to 1.

3. The method according to claim 1, wherein, in step b), the first value is determined by an adaptive pursuit iterative algorithm comprising the following successive steps:
   e1) defining a residue vector ERR0 and assigning to it the value of the first signal;
   e2) searching in the first dictionary matrix for the column vector D0<j> that is most correlated with the residue vector ERR0;
   e3) subtracting, from the residue vector ERR0, the contribution to the residue vector ERR0 of the column vector D0<j> determined in the preceding step;
   e4) repeating the steps e2) and e3) a predetermined number T0 of times; and
   e5) assigning to the first value a value representative of the norm of the residue vector ERR0.

4. The method according to claim 1, wherein, in step c), the second value is determined by an adaptive pursuit iterative algorithm comprising the following successive steps:
   e1') defining a residue vector ERR1 and assigning to it the value of the first signal;
   e2') searching in the second dictionary matrix for the column vector D1<j> that is most correlated with the residue vector ERR1;
   e3') subtracting, from the residue vector ERR1, the contribution to the residue vector ERR1 of the column vector D1<j> determined in the preceding step;
   e4') repeating the steps e2') and e3') a predetermined number T1 of times; and
   e5') assigning to the second value a value representative of the norm of the residue vector ERR1.

5. The method according to claim 1, further comprising a step of securing the electrical system when it is determined in step d) that an electric arc has occurred in the electrical system.

6. The method according to claim 5, wherein the securing step comprises triggering an alarm.

7. The method according to claim 5, wherein the securing step comprises interrupting an electrical supply current of the electrical system.

8. A device for detecting an electric arc in the electrical system comprising a sensor detecting acoustic waves in the system, and an electronic processing device configured to implement a method according to claim 1.

* * * * *